United States Patent
Song et al.

(10) Patent No.: US 11,335,703 B2
(45) Date of Patent: May 17, 2022

(54) DISPLAY PANEL, METHOD FOR MANUFACTURING THE SAME, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Dexiong Song, Beijing (CN); Zhiyong Yang, Beijing (CN); Liwei Huang, Beijing (CN); Shihua Huang, Beijing (CN); Xue Jiang, Beijing (CN); Shibing Yuan, Beijing (CN); Fei Chen, Beijing (CN); Wei Li, Beijing (CN); Chao Fu, Beijing (CN); Na Zhang, Beijing (CN); Yu Du, Beijing (CN); Xuemei Deng, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 239 days.

(21) Appl. No.: 16/349,367

(22) PCT Filed: Sep. 14, 2018

(86) PCT No.: PCT/CN2018/105799
§ 371 (c)(1),
(2) Date: May 13, 2019

(87) PCT Pub. No.: WO2019/095833
PCT Pub. Date: May 23, 2019

(65) Prior Publication Data
US 2020/0266214 A1    Aug. 20, 2020

(30) Foreign Application Priority Data

Nov. 17, 2017  (CN) .......................... 201711145868.0

(51) Int. Cl.
*H01L 27/12* (2006.01)

(52) U.S. Cl.
CPC ...... *H01L 27/1203* (2013.01); *H01L 27/1237* (2013.01); *H01L 27/1248* (2013.01); *H01L 27/1288* (2013.01); *H01L 27/1292* (2013.01)

(58) Field of Classification Search
CPC ......... H01L 27/1248; G02F 1/134309–134336
See application file for complete search history.

(56) References Cited

U.S. PATENT DOCUMENTS

| | | | | |
|---|---|---|---|---|
| 2006/0234491 A1* | 10/2006 | Hu | .......................... | H01L 24/03 438/614 |
| 2012/0168213 A1* | 7/2012 | Park | ........................ | B32B 27/38 174/257 |
| 2017/0062379 A1 | 3/2017 | Zhang et al. | | |

FOREIGN PATENT DOCUMENTS

| CN | 101713875 A | 5/2010 |
|---|---|---|
| CN | 104102030 A | 10/2014 |

(Continued)

OTHER PUBLICATIONS

Machine English Translation of JP 2001358165-A, translation done on Jun. 14, 2021. (Year: 2021).*

(Continued)

*Primary Examiner* — Amar Movva
(74) *Attorney, Agent, or Firm* — Nath, Goldberg & Meyer; Joshua B. Goldberg

(57) ABSTRACT

The present disclosure provides a display panel, a method for manufacturing the same, and a display device. The insulation layer is provided above the first conductive electrodes in the bonding area of the display panel, the insulation (Continued)

layer covers the first conductive electrodes, and the insulation layer is capable of being pierced by ACF particles. When the display panel is bound to an FPC by an ACF, second conductive electrodes on the FPC can be electrically coupled to the first conductive electrodes on the display panel through the ACF particles, thereby achieving the bonding connection between the display panel and the FPC, even if a conductive foreign object falls into the area where the first conductive electrodes are located, short circuit cannot be caused, thereby improving the product yield.

10 Claims, 2 Drawing Sheets

(56) References Cited

FOREIGN PATENT DOCUMENTS

| | | |
|---|---|---|
| CN | 104516134 A | 4/2015 |
| CN | 107784952 A | 3/2018 |
| JP | 2001358165 A * | 12/2001 |

OTHER PUBLICATIONS

International Search Report dated Dec. 19, 2018 corresponding to application No. PCT/CN2018/105799.

* cited by examiner

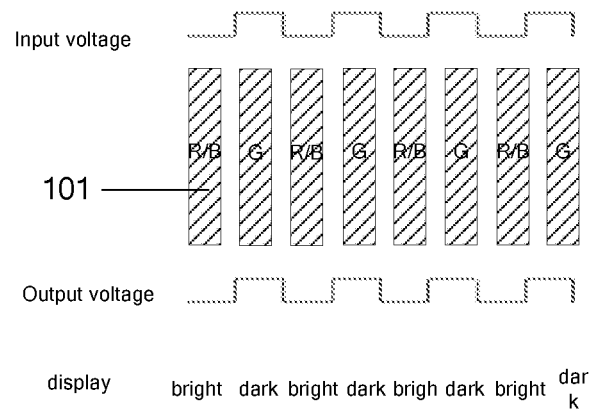
FIG. 1
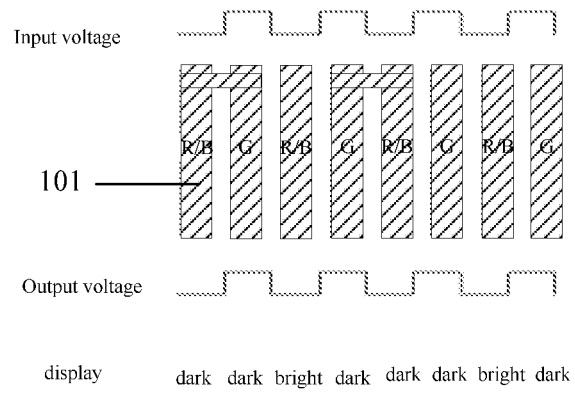
FIG. 2a
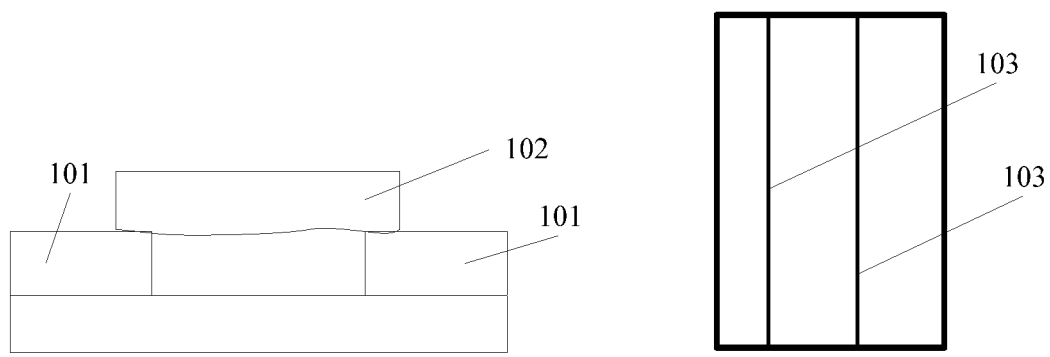
FIG. 2b
FIG. 2c

DISPLAY PANEL, METHOD FOR MANUFACTURING THE SAME, AND DISPLAY DEVICE

CROSS-REFERENCE TO RELATED APPLICATION

This is a National Phase Application filed under 35 U.S.C. 371 as a national stage of PCT/CN2018/105799, filed Sep. 14, 2018, an application claiming the benefit of Chinese Patent Publication No. 201711145868.0, filed on Nov. 17, 2017, the content of each of which is hereby incorporated by reference in its entirety.

TECHNICAL FIELD

The present disclosure relates to the field of display technology, and in particular, to a display panel, a method for manufacturing the same, and a display device.

BACKGROUND

With the continuous advancement of science and technology, the position of visual information is becoming more and more important in people's lives. Therefore, flat panel display devices carrying visual information are also playing an increasingly important role in people's lives. These common flat panel display devices include liquid crystal display devices (LCDs), organic electroluminescent diodes (OLEDs), and the like. Improving the display quality of the display has become the focus of attention.

SUMMARY

An embodiment of the present disclosure provides a display panel including a plurality of first conductive electrodes provided in a bonding area and on a base substrate, wherein the display panel further including an insulation layer capable of being pierced by anisotropic conductive film particles, the insulation layer covering the plurality of first conductive electrodes.

In some implementations, a gap is provided between any adjacent first conductive electrodes, and the insulation layer further covers gaps among the first conductive electrodes.

In some implementations, the insulation layer further covers a display area of the display panel, and a thickness of the insulation layer in the bonding area is smaller than a thickness of the insulation layer in the display area.

In some implementations, a portion of the insulation layer covering the first conductive electrodes has a thickness ranging from 0.5 micrometer to 1 micrometer.

In some implementations, the insulation layer is made of an organic insulation material.

In some implementations, the insulation layer is made of polyimide.

In some implementations, the insulation layer is made of an inorganic insulating material.

An embodiment of the present disclosure provides a display device including the above display panel.

In some implementations, the display device further includes a flexible printed circuit board, the flexible printed circuit board being provided on a side of the insulation layer away from the first conductive electrodes, a plurality of second conductive electrodes are provided on the flexible printed circuit board, and the second conductive electrodes are bound to the first conductive electrodes on the display panel through an anisotropic conductive film containing anisotropic conductive film particles in the bonding area, wherein the anisotropic conductive film particles are capable of piercing the insulation layer so that the second conductive electrodes are coupled to the first conductive electrodes through the anisotropic conductive film particles.

An embodiment of the present disclosure provides a method for manufacturing a display panel, including the steps of: forming a pattern of first conductive electrodes on a base substrate, wherein the pattern of the first conductive electrodes is formed in a bonding area of the display panel; forming a pattern of an insulation layer on the base substrate on which the pattern of the first conductive electrodes has been formed, wherein the pattern of the insulation layer covers the pattern of the first conductive electrodes, and the pattern of the insulation layer is capable of being pierced by anisotropic conductive film particles.

In some implementations, the pattern of the insulation layer further covers a gap between any adjacent first conductive electrodes and a display area of the display panel, and the step of forming the pattern of the insulation layer includes: forming the pattern of the insulation layer by a photolithography process using a halftone mask such that a thickness of the pattern of the insulation layer in the bonding area is smaller than a thickness of the pattern of the insulation layer in the display area, wherein the halftone mask covers the bonding area and the display area, and a light transmittance of a region of the halftone mask corresponding to the display area is smaller than a light transmittance of a region of the halftone mask corresponding to the bonding area.

In some implementations, a material of the insulation layer includes an organic material.

In some implementations, the organic material includes polyimide.

In some implementations, the pattern of the insulating layer further covers a gap between any adjacent first conductive electrodes and a display area of the display panel, and the material of the pattern of the insulation layer is an inorganic insulation material; the step of forming the pattern of the insulation layer includes forming the pattern of the insulation layer by a chemical vapor deposition process.

BRIEF DESCRIPTION OF THE DRAWINGS

FIG. 1 is a schematic diagram showing a case where conductive electrodes are not short-circuited in a display panel in the related art;

FIG. 2a is a schematic diagram showing a case where conductive electrodes are short-circuited in a display panel in the related art;

FIG. 2b is another schematic diagram showing a case where conductive electrodes are short-circuited in a display panel in the related art;

FIG. 2c is still another schematic diagram showing a case where conductive electrodes are short-circuited in a display panel in the related art;

REFERENCE SIGNS 101, conductive electrode; 102, conductive foreign object; 103, dark line; 10, display panel; 20, FPC; 1, base substrate; 2, first conductive electrode; 3, ACF particles; 4, insulation layer; 5, buffer layer; 6, gate line; 7, gate insulation layer; 8, interlayer insulation layer; and 9, second conductive electrode.

DETAILED DESCRIPTION

The technical solutions in the present disclosure will be clearly and completely described in conjunction with the drawings in the present disclosure. It is obvious that the described embodiments are a part of embodiments of the present disclosure, and not all of embodiments of the present disclosure. All other embodiments obtained by a person of ordinary skill in the art based on the embodiments of the present disclosure without creative labor fall within the protection scope of the present disclosure.

As shown in FIG. 1, FIG. 2a, and FIG. 2b, gaps among the conductive electrodes 101 in the bonding area (i.e., the PAD region) of the display panel are smaller and smaller, the conductive electrodes 101 are metal electrodes, if a conductive foreign object 102 falls onto the conductive electrodes, short-circuit between adjacent conductive electrodes 101 may easily occur, in this case, in a pixel circuit, when a voltage Vdata on a data line is a high voltage, the display is dark, and when the voltage Vdata is a low voltage, the display is bright.

As shown in FIG. 2a and FIG. 2c, when a picture is displayed, if adjacent conductive electrodes 101 are short-circuited, the voltage on the conductive electrode 101 to which a low voltage is input is pulled up by the conductive electrode 101 to which a high voltage is input, which in turn produces a dark line 103.

Therefore, there is an urgent need for a display panel, a method of manufacturing the same, and a display device to solve the above problems.

Figure 3:
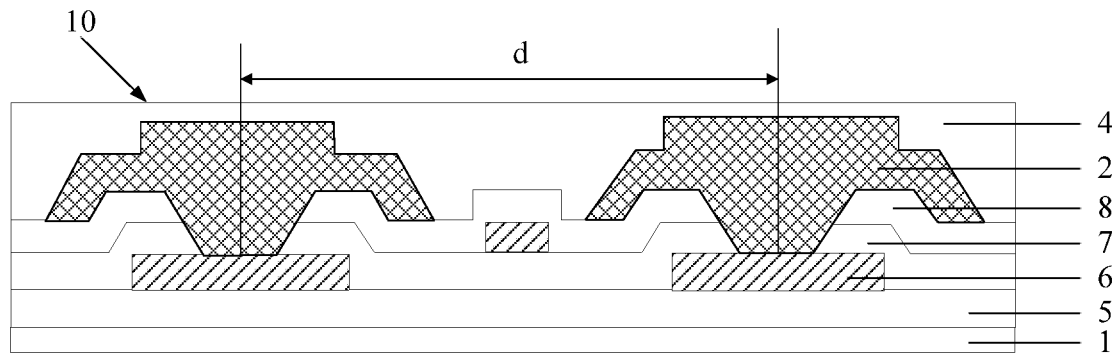
FIG. 3 is a schematic structural diagram of a binding area of a display panel according to an embodiment of the present disclosure.
Figure 5:
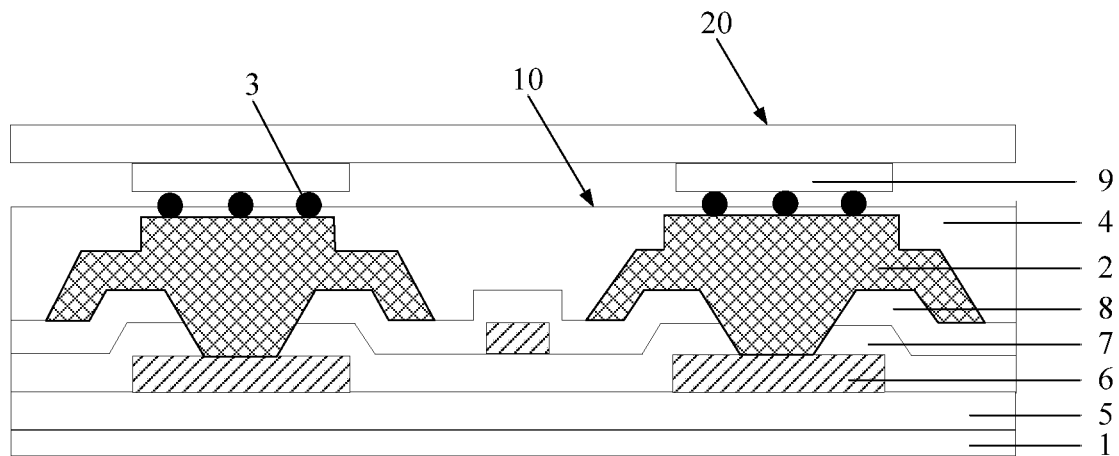
FIG. 5 is a schematic diagram showing a state in which a display panel is bound according to an embodiment of the present disclosure.

As shown in FIG. 3 and FIG. 5, the present disclosure provides a display panel 10 including a base substrate 1 and a plurality of first conductive electrodes 2 provided on the base substrate 1, the first conductive electrodes 2 are provided in a bonding area and a gap d is provided between any adjacent first conductive electrodes 2. The display panel 10 further includes an insulation layer 4 that is capable of being pierced by anisotropic conductive film (ACF) particles 3, and the insulation layer 4 covers the first conductive electrodes 2.

In the display panel 10 in the present disclosure, an insulation layer 4 is provided above the first conductive electrodes 2 in the bonding area of the display panel, the insulation layer 4 covers the first conductive electrodes 2, and the insulation layer 4 can be pierced by the ACF particles 3. When the display panel 10 is bound to the flexible printed circuit (FPC) 20 by the ACF, second conductive electrodes 9 of the FPC 20 can be electrically coupled to the first conductive electrodes 2 of the display panel 10 through the ACF particles 3, therefore, a bonding connection between the display panel 10 and the FPC 20 is achieved. Even if a conductive foreign object 102 falls into the region where the first conductive electrodes 2 are located, the short circuit between the first conductive electrodes 2 cannot be caused, thereby improving the product yield.

Figure 4:
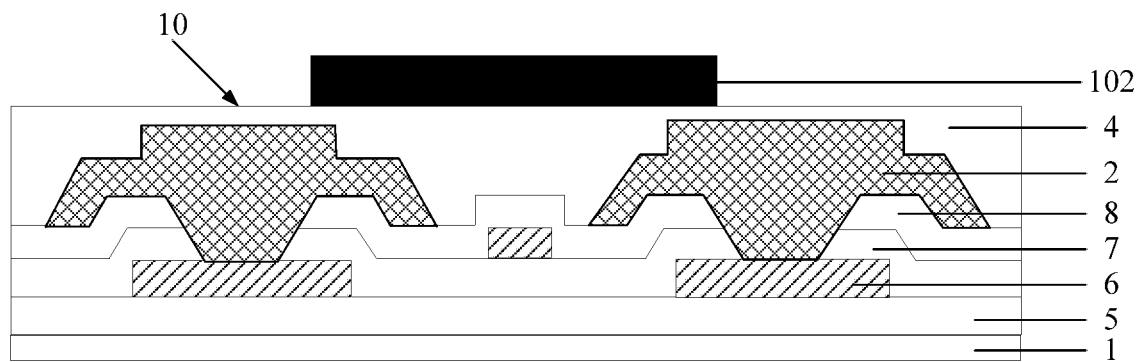
FIG. 4 is a schematic diagram showing a case where a conductive foreign object falling in a binding area of a display panel according to an embodiment of the present disclosure.

The display panel 10 may further include a buffer layer 5, a gate line 6, a gate insulation layer 7 and an interlayer insulation layer 8, and the buffer layer 5, the gate line 6, the gate insulation layer 7 and the interlayer insulation layer 8 are provided between the first conductive electrodes 2 and the base substrate 1. It should be noted that FIGS. 3 to 5 show schematic structural diagrams of the bonding area of the display panel 10, wherein the gate line 6 is coupled to the gate of the thin film transistor in the display area.

Since there is a gap d between any adjacent first conductive electrodes 2, a foreign object such as dust easily falls into the gaps d of the first conductive electrodes 2, and it is difficult to clean. In order to solve the above problem, in an embodiment, the insulation layer 4 also covers the gaps d among the first conductive electrodes, that is, the insulation layer 4 covers not only the first conductive electrodes 2 but also the gaps d among the first conductive electrodes.

Further, the insulation layer 4 also covers the display area (not shown) of the display panel 10. In order to ensure that the ACF particles 3 can pierce the insulation layer 4 to successfully achieve bonding between the display panel 10 and the FPC 20, the insulation layer 4 in the bonding area, especially a portion of the insulation layer 4 above the first conductive electrodes 2, cannot be too thick. However, it also required that the insulation layer 4 can play an insulation role in the display area, thus the insulation layer 4 cannot be too thin. Therefore, in the embodiment of the present disclosure, the thickness of the insulation layer 4 in the bonding area is smaller than the thickness of the insulation layer 4 in the display area.

In a specific embodiment, the portion of the insulation layer 4 above the first conductive electrodes 2 has a thickness ranging from 0.5 micrometer to 1 micrometer and the ACF particles 3 can pierce the insulation layer 4 to ensure successful bonding of the display panel 10 and the FPC 20.

The material of the insulation layer 4 may be an organic insulation material, for example, may be polyimide, alternatively, the material of the insulation layer 4 may also be an inorganic insulation material. The manufacturing process of the insulation layer 4 by using an organic insulating material is different from that by using an inorganic insulating material, which will be described in detail later.

In the embodiment of the present disclosure, types of the display panel are not limited, and the display panel 10 may be a liquid crystal display panel or an OLED (Organic Light-Emitting Diode) display panel.

The present disclosure also provides a display device. As shown in FIG. 5, the display device includes the display panel 10 as described above, specific structure of the display panel 10 will not be described repeatedly herein.

Further, the display device further includes an FPC 20, the FPC 20 is provided at a side of the insulation layer 4 away from the first conductive electrodes 2, and the FPC 20 is provided with second conductive electrodes 9 thereon, the second conductive electrodes 9 are bound to the first conductive electrodes 2 of the display panel 10 by the ACF in the bonding area. The ACF particles 3 included in the ACF can pierce the insulation layer 4, thus the second conductive electrodes 9 are electrically coupled (conducted) to the first conductive electrodes 2 through the ACF particles 3.

When the FPC 20 is bound to the display panel 10, the FPC 20 and the display panel 10 are required to be pressed together with force, during which the ACF between the FPC 20 and the display panel 10 is stressed, and the ACF particles 3 can pierce the insulation layer 4, thus the second electrodes 9 can be electrically coupled to the first electrodes 2 through the ACF particles 3.

In the display panel 10 provided in the present disclosure, the insulation layer 4 is provided above the first conductive electrodes 2 in the bonding area of the display panel, the insulation layer 4 covers not only the first conductive electrodes 2 but also the gaps d among the first conductive electrodes 2, the insulation layer 4 can be pierced by the ACF particles 3, and when the display panel 10 is bound to the FPC 20 by the ACF, the second conductive electrodes 9 of the FPC 20 can be electrically coupled to the first conductive electrodes 2 of the display panel 10 through the ACF particles 3, therefore, a bonding connection between the display panel 10 and the FPC 20 is achieved. Even if a conductive foreign object 102 falls into the region where the first conductive electrodes 2 are located, short circuit between the first conductive electrodes 2 cannot be caused, thereby improving the product yield.

The display device may be any product or component having a display function, such as an electronic paper, a mobile phone, a tablet computer, a display, a notebook computer, a digital photo frame, a navigator, and the like.

An embodiment of the present disclosure further provides a method for manufacturing a display panel, the method comprising the following steps S1 and S2.

At step S1, patterns of first conductive electrodes 2 are formed on a base substrate 1.

Specifically, the patterns of the first conductive electrodes 2 may be formed on the base substrate 1 by a patterning process, wherein the patterns of the first conductive electrodes 2 are located in a bonding area of the display panel 10.

Step 2, a pattern of an insulation layer 4 is formed on the base substrate 1 on which the pattern of the first conductive electrodes 2 has been formed.

The pattern of the insulation layer 4 covers the patterns of the first conductive electrodes 2, and the pattern of the insulation layer 4 can be pierced by the ACF particles 3. In a specific implementation, a gap d is provided between any adjacent patterns of the first conductive electrodes 2, and the insulation layer 4 can also cover the gaps d among the first conductive electrodes 2 and the display area of the display panel 10.

Specifically, the pattern of the insulation layer 4 may be formed in the following two methods.

In a first method, the pattern of the insulation layer 4 can be formed by a photolithography process by using a halftone mask, a thickness of the pattern of the insulation layer 4 in the bonding area is smaller than a thickness of the pattern of the insulation layer 4 in the display area. The halftone mask covers the bonding area and the display area, and a transmittance of a region of the halftone mask corresponding to the display area is smaller than a transmittance of a region of the halftone mask corresponding to the bonding area. For example, a blocking region of the halftone mask corresponds to the display area of the display panel 10 (the insulation layer 4 in this region is not exposed, and the insulation layer 4 is thick), and a semi-transmissive region of the halftone mask corresponds to the bonding area of the display panel 10 (the insulation layer 4 in this region is partially exposed, and the insulation layer 4 is thin), a transmissive region of the halftone mask corresponds to a peripheral region of the display panel 10 other than the bonding area (the insulation layer 4 in this region is completely exposed, that is, completely removed). In this way, the pattern of the insulation layer 4 in the bonding area and the pattern of the insulation layer 4 in the display area can be manufactured by using only one mask, thus the number of the masks and processes are reduced, the production cost is reduced, and the production efficiency is improved.

Certainly, those skilled in the art can also know that the pattern of the insulation layer in the display area and the pattern of the insulation layer in the bonding area can be separately manufactured by two photolithography processes by using two masks.

It should be noted that the insulation layer 4 formed by the first method is an organic insulation layer.

In a second method, when the pattern of the insulation layer 4 is made of an inorganic insulation material, the pattern of the insulation layer 4 can be formed by a Chemical Vapor Deposition (CVD) process. Specifically, the thickness of the insulation layer 4 can be controlled by controlling deposition time and the deposition rate, that is, the deposition time and deposition rate of the inorganic insulation material in the bonding area are smaller than the deposition time and deposition rate of the inorganic insulation material in the display area.

The present disclosure can achieve the following beneficial effects.

In the display panel and the method for manufacturing the same, and the display device provided by the present disclosure, the insulation layer is provided above the first conductive electrodes in the binding area of the display panel, the insulation layer covers the first conductive electrodes, and the insulation layer can be pierced by the ACF particles. When the display panel is bound to the FPC by the ACF, the second conductive electrodes of the FPC can be electrically coupled to the first conductive electrodes of the display panel through the ACF particles, thereby achieving the binding connection between the display panel and the FPC, even if a conductive foreign object falls into the area where the first conductive electrodes are located, short circuit cannot be caused, thereby improving the product yield.

It should be understood that, the above embodiments are merely exemplary embodiments for explaining principle of the present invention, but the present invention is not limited thereto. Various modifications and improvements may be made by those ordinary skilled in the art within the spirit and essence of the present invention, these modifications and improvements fall into the protection scope of the present invention.

What is claimed is:

1. A display panel having a display area and a bonding area at a periphery of the display area and comprising a plurality of first conductive electrodes provided in a bonding area and on a base substrate, wherein the display panel further comprising an insulation layer capable of being pierced by anisotropic conductive film particles, the insulation layer covering the plurality of first conductive electrodes, and wherein the insulation layer further covers a display area of the display panel, and a thickness of the insulation layer in the bonding area is smaller than a thickness of the insulation layer in the display area, and wherein the insulation layer is made of polyimide.

2. The display panel according to claim 1, wherein a gap is provided between any adjacent first conductive electrodes, and the insulation layer further covers gaps among the first conductive electrodes.

3. A display device comprising the display panel according to claim 2.

4. The display panel according to claim 1, wherein a portion of the insulation layer covering the first conductive electrodes has a thickness ranging from 0.5 micrometer to 1 micrometer.

5. A display device comprising the display panel according to claim 4.

6. A display device comprising the display panel according to claim 1.

7. The display device according to claim 6, further comprising a flexible printed circuit board, the flexible printed circuit board being provided on a side of the insulation layer away from the first conductive electrodes, a plurality of second conductive electrodes are provided on the flexible printed circuit board, and the second conductive electrodes are bound to the first conductive electrodes on the display panel through a anisotropic conductive film containing anisotropic conductive film particles in the bonding area, wherein the anisotropic conductive film particles are capable of piercing the insulation layer so that the second conductive electrodes are coupled to the first conductive electrodes through the anisotropic conductive film particles.

8. A method for manufacturing a display panel having a display area and a bonding area at a periphery of the display area and, comprising:

forming a pattern of first conductive electrodes on a base substrate, wherein the pattern of the first conductive electrodes is formed in a bonding area of the display panel;

forming a pattern of an insulation layer on the base substrate on which the pattern of the first conductive electrodes has been formed, wherein the pattern of the insulation layer covers the pattern of the first conductive electrodes, and the pattern of the insulation layer is capable of being pierced by anisotropic conductive film particles, wherein the pattern of the insulation layer further covers the display area of the display panel, and a thickness of the pattern of the insulation layer in the bonding area is smaller than a thickness of the pattern of the insulation layer in the display area, and the organic material comprises polyimide.

9. The method according to claim 8, wherein the pattern of the insulation layer further covers a gap between any adjacent first conductive electrodes and a display area of the display panel, and the step of forming the pattern of the insulation layer includes:

forming the pattern of the insulation layer by a photolithography process using a halftone mask, wherein the halftone mask covers the bonding area and the display area, and a light transmittance of a region of the halftone mask corresponding to the display area is smaller than a light transmittance of a region of the halftone mask corresponding to the bonding area.

10. The method according to claim 8, wherein the pattern of the insulating layer further covers a gap between any adjacent first conductive electrodes and the display area of the display panel, and the material of the pattern of the insulation layer is an inorganic insulation material;

the step of forming the pattern of the insulation layer comprises forming the pattern of the insulation layer by a chemical vapor deposition process.

* * * * *